(12) United States Patent
Huber et al.

(10) Patent No.: US 7,606,107 B2
(45) Date of Patent: Oct. 20, 2009

(54) MEMORY CELL, READ DEVICE FOR MEMORY CELL, MEMORY ASSEMBLY, AND CORRESPONDING METHOD

(75) Inventors: Peter Huber, München (DE); Yannick Martelloni, München (DE); Thomas Nirschl, Essex Junction, VT (US); Martin Ostermayr, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 261 days.

(21) Appl. No.: 11/476,383

(22) Filed: Jun. 27, 2006

(65) Prior Publication Data

US 2007/0159894 A1    Jul. 12, 2007

(30) Foreign Application Priority Data

Jun. 27, 2005  (DE) .................. 10 2005 029 872

(51) Int. Cl.
    *G11C 8/00* (2006.01)
(52) U.S. Cl. ............... 365/230.05; 365/189.04; 365/189.15; 365/189.16
(58) Field of Classification Search ............ 365/230.05, 365/189.04, 189.15, 189.16
    See application file for complete search history.

(56) References Cited

U.S. PATENT DOCUMENTS

| | | | |
|---|---|---|---|
| 4,125,877 A * | 11/1978 | Reinert | ................ 365/190 |
| 4,803,664 A | 2/1989 | Itoh | |
| 5,646,903 A * | 7/1997 | Johnson | ................ 365/230.05 |
| 6,016,268 A * | 1/2000 | Worley | ................ 365/149 |
| 6,181,634 B1 * | 1/2001 | Okita | ................ 365/230.05 |
| 6,347,050 B1 | 2/2002 | Mukai et al. | |
| 6,473,334 B1 * | 10/2002 | Bailey et al. | ................ 365/154 |
| 6,552,951 B1 * | 4/2003 | Raj et al. | ................ 365/230.05 |
| 6,990,025 B2 * | 1/2006 | Kirihata et al. | ........ 365/189.07 |
| 7,154,078 B2 * | 12/2006 | Barna et al. | ............. 250/214 R |
| 2004/0041080 A1 | 3/2004 | Barna et al. | |

FOREIGN PATENT DOCUMENTS

DE    2 251 640    5/1973

OTHER PUBLICATIONS

Abbott, Robert A. et al., "A 4K MOS Dynamic Random-Access Memory," IEEE Journal of Solid-State Circuits, vol. SC-8, No. 5, pp. 292-298 (Oct. 1973).
Regitz, William M. et al., "Three-Transistor-Cell 1024-Bit 500-ns MOS RAM," IEEE Journal of Solid-State Circuits, vol. SC-5, No. 5, pp. 181-186 (Oct. 1970).

* cited by examiner

*Primary Examiner*—Pho M. Luu
(74) *Attorney, Agent, or Firm*—Dicke, Billig & Czaja, PLLC (57) ABSTRACT

A memory cell includes transistors and two read ports. Each read port is configured to be connected to a read line. The memory cell is configured such that in a read operation of the memory cell an information stored in the memory cell is readable by a differential reading including an evaluation of an electric current between the two read ports.

31 Claims, 4 Drawing Sheets

MEMORY CELL, READ DEVICE FOR MEMORY CELL, MEMORY ASSEMBLY, AND CORRESPONDING METHOD

CROSS-REFERENCE TO RELATED APPLICATIONS

This Utility Patent Application claims priority to German Patent Application No. DE 10 2005 029 782.9, filed on Jun. 27, 2005, which is incorporated herein by reference.

BACKGROUND

Modern semiconductor circuits employ memory assemblies with large memory capacity, which are frequently embedded in the respective semiconductor circuit. It is desirable for memory assemblies to have high access speed, lower supply voltage, and lower power consumption or energy consumption. As a result, memory assemblies typically are optimized with regard to access speed, space requirement, and dynamic and static power consumption.

A typical six transistor (6T) memory cell has a relatively high leakage current. In addition the space requirement of a typical 6T memory cell is relatively high. Alternative memory cells, which have a lower space requirement than the typical 6T memory cell, normally are refreshed and mostly have a greater access time than the typical 6T memory cell. For example, a three transistor (3T) cell, which is an alternative conventional memory cell with a large capacity, typically employs separate metal lines for reading and writing and for the supply voltage. Alternatively, the port for the read and write word line can be connected on the 3T memory cell, however, this results in some disadvantages for the 3T memory cell.

Therefore, it would be desirable for a memory cell to have a low space requirement, a short access time, and low power consumption, as well as needing only a low supply voltage. Furthermore, a need exists for a read device which has a low space requirement and low power consumption, as well as needing only a low supply voltage.

For these and other reasons, there is a need for the present invention.

SUMMARY

One embodiment provides a memory cell including transistors and two read ports. Each read port is configured to be connected to a read line. The memory cell is configured such that in a read operation of the memory cell an information stored in the memory cell is readable by a differential reading including an evaluation of an electric current between the two read ports.

One embodiment provides a read device including transistors, two input terminals, and one output terminal. The read device is configured to read a one-bit information via a current that flows between the two input terminals, provide the one-bit information via the output terminal, and set its own operating point by setting the potential of the two input terminals.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the possible advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments relate to a memory cell, for which an item of information stored in the memory cell can be captured by a differential read operation, and a read device, and is configured to set its own operating point. In addition, embodiments relate to memory assemblies with such a memory cell and read device and a method for reading a memory cell.

One embodiment of a memory cell comprises two read ports, each of which is connected to a read line. An item of information stored in the memory cell is readable by a differential read operation.

One embodiment of a differential read operation is a read operation in which an electric current or a magnitude of the electric current between the two read ports, or a potential difference or a value of the potential difference between the two read ports, is evaluated.

One embodiment of a read device has two input terminals and one output terminal. The read device is able to capture a 1-bit information item via a current flowing between the two input terminals, and present it to the output terminal.

Figure 1:
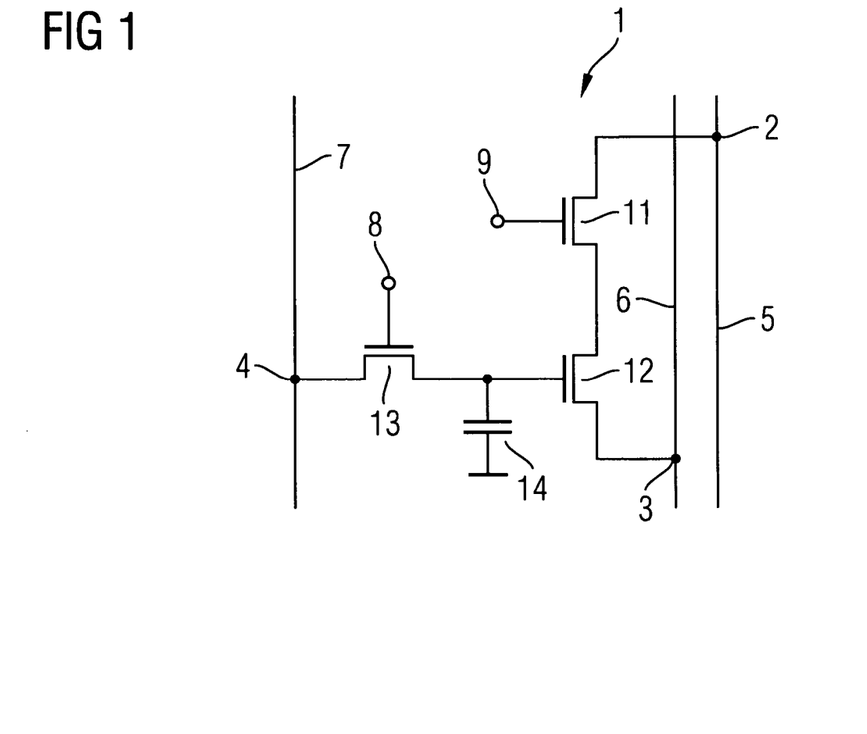
FIG. 1 illustrates one embodiment of a memory cell.

FIG. 1 illustrates one embodiment of a memory cell 1 having three NMOS transistors 11, 12, and 13. A first read port 2 of the memory cell 1 is connected to a first read line 5. A second read port 3 of the memory cell 1 is connected to a second read line 6. A write port 4 of the memory cell 1 is connected to a write line 7. The first read port 2 is connected to the drain terminal of a first transistor 11 of the three NMOS transistors, whose source terminal is connected to the drain terminal of a second transistor 12 of the three NMOS transistors. The control input 9 of the first NMOS transistor 11 is simultaneously a read control terminal 9 of the memory cell 1. The second read port 3 is connected to the source terminal of the second NMOS transistor 12, while the write port 4 is connected to the drain terminal of a third transistor 13 of the three NMOS transistors. The source terminal of the third NMOS transistor 13 is connected to a capacitor 14 of the memory cell 1 and to the control input of the second NMOS transistor 12. A second terminal of the capacitor 14 is connected to ground and the control input 8 of the third NMOS transistor 13 is connected to a write control terminal 8 of the memory cell 1.

In one embodiment, the second terminal of the capacitor can be connected to a reference potential (instead of ground).

To write an item of information into the memory cell 1, the write line 7 is set according to the information to be written, to a potential, which represents a binary 0 or 1 (e.g., $V_{SS}$ or $V_{DD}$), and then the write control terminal 8 is activated, as a result of which the third NMOS transistor 13 becomes conductive and the capacitor 14 accepts the potential of the write line 7 and thus stores the binary 0 or 1.

To read an item of information from the memory cell 1, the first read line 5 is pre-charged to a potential corresponding to the binary 1 (e.g., $V_{DD}$) and the second read line 6 to a potential corresponding to the binary 0 (e.g., $V_{SS}$). The read control terminal 9 is then activated, so that the first transistor 11 becomes conductive. If the charge stored by the capacitor 14 corresponds to a binary 1 (e.g., $V_{DD}$), the transistor 12 is also turned on, so that a low-impedance connection exists between the two read lines 5, 6, which reduces the potential difference between the two read lines 5, 6. On the other hand, the second transistor 12 is not turned on if the capacitor 14 contains a charge that represents the binary 0 (e.g., $V_{SS}$), so that the electrical connection of the first and second transistors 11, 12 between the two read lines 5, 6 is high-impedance and the two read lines 5, 6 level their potential difference much more slowly.

Thus, in the case that a binary 1 is stored by the capacitor, a greater current flows between the read ports 2, 3 than in the case that a binary 0 is stored by the capacitor.

If, in one embodiment, p-channel transistors are used instead of the NMOS transistors, control signals that are connected to the control inputs of the transistors are correspondingly inverted. In this embodiment, current flows for a stored 0.

It noted that the two read lines 5, 6 can also be pre-charged in the opposite way before a read operation (i.e., the first read line 2 with a potential corresponding to the binary 0, and the second read line 6 with a potential corresponding to the binary 1). However, the first specified potential distribution in relation to the read lines 5, 6 is better suited to the structure of the memory cell 1 with regard to the access time of the memory cell 1, because in the event that the capacitor 14 represents a binary 1, the potential difference between the two read lines 5, 6 is more quickly levelled in the first potential distribution, or the current between the two read ports 2, 3 is greater that in the second potential distribution.

It is further noted that the memory cell 1 does not need any feed of a supply voltage apart from a well and substrate contact. The reference potential for the capacitance or the capacitor 14 can be fed via a supply line, which is the same for all memory cells of a memory assembly which contains several memory cells 1.

FIGS. 2 to 5 illustrate more embodiments of the memory cell 1. The same reference numerals denote the same elements of the memory cell 1. Elements that have already been described for a previously described embodiment are therefore not repetitively described in the text below, which concentrates on the respective special features.

Figure 2:
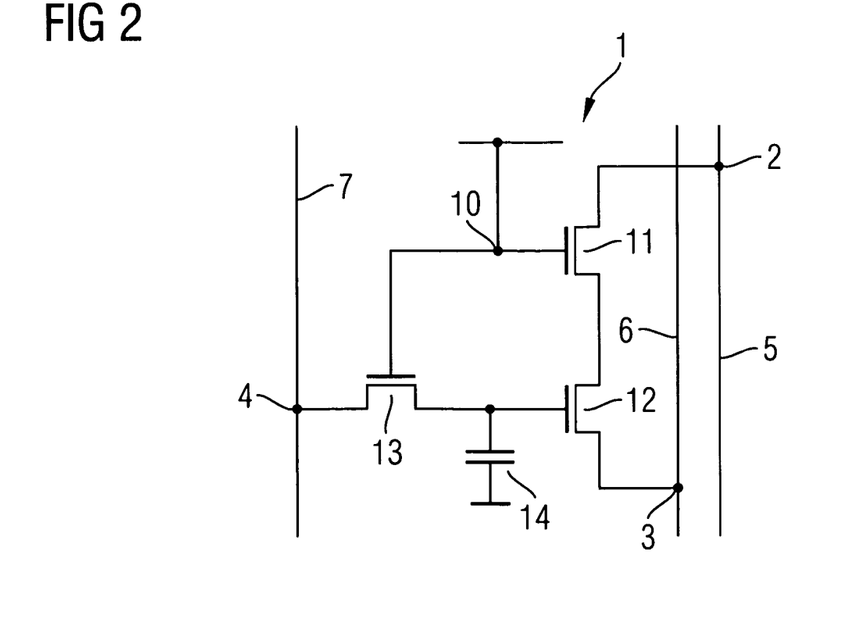
FIG. 2 illustrates one embodiment of a memory cell.

The difference between the embodiment illustrated in FIG. 2 and the embodiment illustrated in FIG. 1 is that the read control terminal 9 and the write control terminal 8 are combined in one control terminal 10 or a combined read/write control terminal.

The embodiment of FIG. 1 has an advantage over the embodiment of FIG. 2 that a first memory cell, which is connected to the same read lines 5, 6 and the same write line 7 as a second memory cell 1, can be read or written while the second memory cell 1 is simultaneously being written or read respectively. This is possible if both the first and the second memory cell 1 each have a read control terminal 9, which is separate from the write control terminal 8, because in this configuration the one memory cell 1 can be activated to write while the other is being read.

On the other hand, if the first and the second memory cell 1 are connected to different read lines 5, 6 and different write lines 7 or if it is ensured that the one memory cell 1 is not activated via the control terminal 10 when the other is activated, the embodiment of FIG. 2 offers an advantage that only one control line has to be connected to each memory cell 1, which is advantageous for a wiring of a memory assembly which comprises the memory cells.

Figure 3:
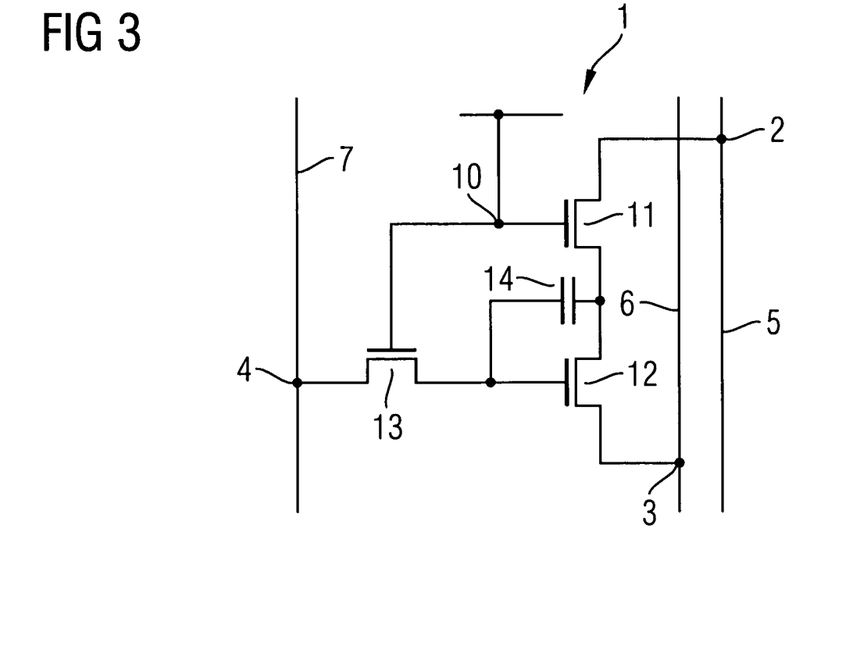
FIG. 3 illustrates one embodiment of a memory cell.

In the embodiment of a memory cell 1 illustrated in FIG. 3, the second terminal of the capacitor is electrically connected to the electrical connection of the drain terminal of the first NMOS transistor 11 and the source terminal of the second NMOS transistor 12.

Figure 4:
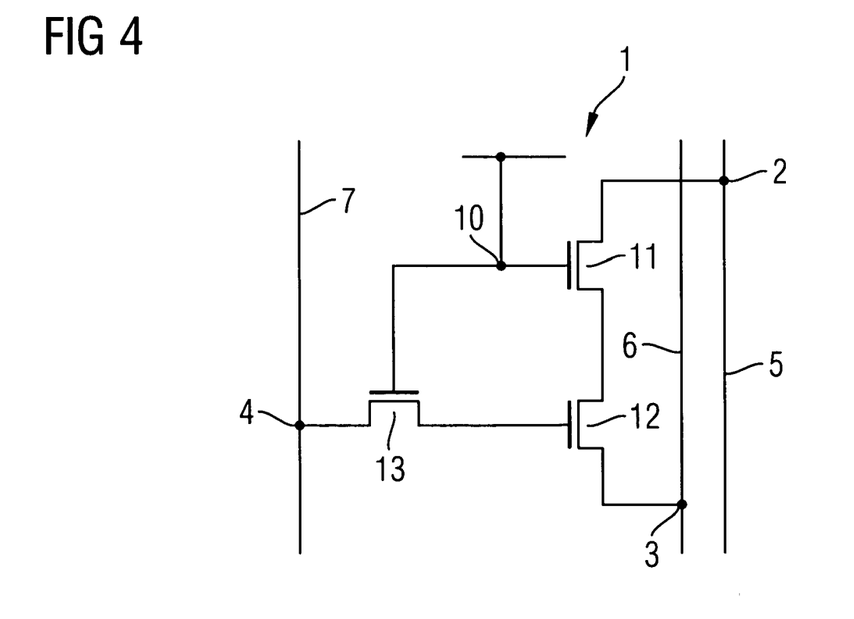
FIG. 4 illustrates one embodiment of a memory cell.

In the embodiment of a memory cell illustrated in FIG. 4, no capacitor is illustrated; otherwise the embodiment of FIG. 4 is the same as the embodiment of FIG. 2 or the embodiment of FIG. 3. In the embodiment of FIG. 4, the input MOS capacitance of the control input of the second transistor 12 is used to store the charge, which corresponds to the information that is stored by the memory cell 1.

Figure 5:
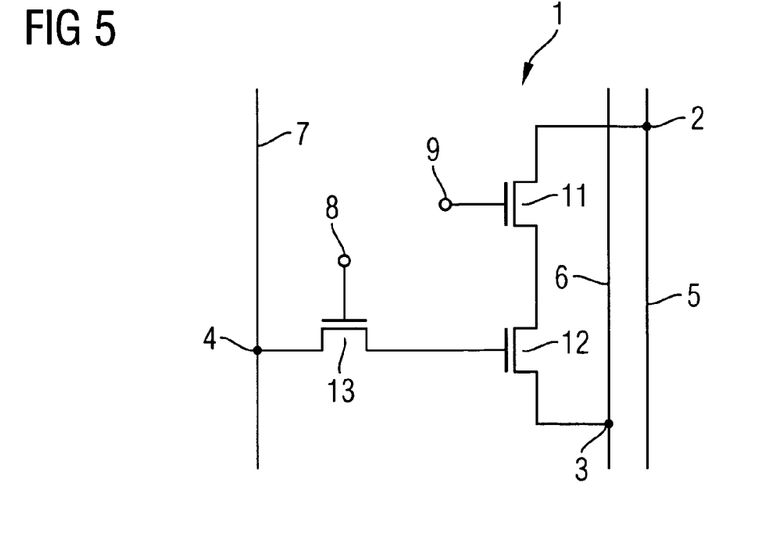
FIG. 5 illustrates one embodiment of a memory cell.

The memory cell 1 embodiment illustrated in FIG. 5 substantially corresponds to the embodiment illustrated in FIG. 1 with a read control terminal 9 and a write control terminal 8, while as in the embodiment of FIG. 4 the capacitance is formed by the input MOS capacitance of the input of the second transistor 12.

In all embodiments, the NMOS transistors could be replaced by PMOS transistors. In this case the control terminals 8, 9, and 10 would be activated inversely, in order respectively to write or read the memory cell. For an optimal read operation, the first read line 5 can be pre-charged with a potential corresponding to a binary 0 and the second read line 6 with a potential corresponding to a binary 1. The reaction of the memory cell 1 in a read operation is redefined such that the memory cell 1 supplies a low-impedance electrical connection between the two read lines 5, 6, if it stores a binary 0, and otherwise allows the high-impedance electrical connection between the two read lines 5, 6.

The memory cell according to the above embodiments is constructed in a very compact way, and compared to conventional memory cells has only a low space requirement. In addition, the differential read operation can ensure a short access time in comparison for example with a read operation in which only one read line or a potential of the read line is reloaded.

As described above, the three transistors can all be of the same conductivity type, for example the three transistors can all be NMOS transistors or all PMOS transistors.

Alternatively, the three transistors may have any possible combination of NMOS and PMOS transistors. For example, one can be a PMOS transistor and the two others can be NMOS transistors.

In embodiments where three transistors are of the same conductivity type, the minimum distance between an n+ doped area and a p+ doped area is irrelevant for the memory cell. This minimum distance is pertinent for memory assemblies whose semiconductor circuits are produced using phase shifting mask (PSM) lithography (e.g., employed from a structure width of 65 nm or less), because in this structure all poly connections run parallel. The typical 6T cell for example thereby contains twice the above mentioned minimum distance within a cell. In summary, memory cells of embodiments which have transistors with the same conductivity type can be implemented more efficiently in terms of space requirement, in PSM lithography in particular, than memory cells which include transistors with different conductivity types.

As described above, embodiments of the memory cell may have a capacitance, in order to save the information to be stored in the memory cell.

As a result of the capacitance, these memory cell embodiments are more robust against radiation (e.g., cosmic radiation). Since the capacitance makes the charge representing information stored by the memory cell greater than would be the case without the additional capacitance, this charge is less easily changed by radiation in such a way that the information stored in the memory cell is also changed at the same time. As a result of the presence of the capacitance, a pulse storage time (i.e., time interval that elapses until the information to be stored by the memory cell is saved in the memory cell) is small enough that requirements for a clock rate of a semiconductor circuit containing the memory cell can be satisfied.

The memory cell according to embodiments described herein can be integrated into a standardized semiconductor circuit manufacturing process, as like conventional memory cells embodiments of memory cells described herein also have only one capacitance (which for a development process represents a certain particularity in comparison to transistors).

Figure 6:
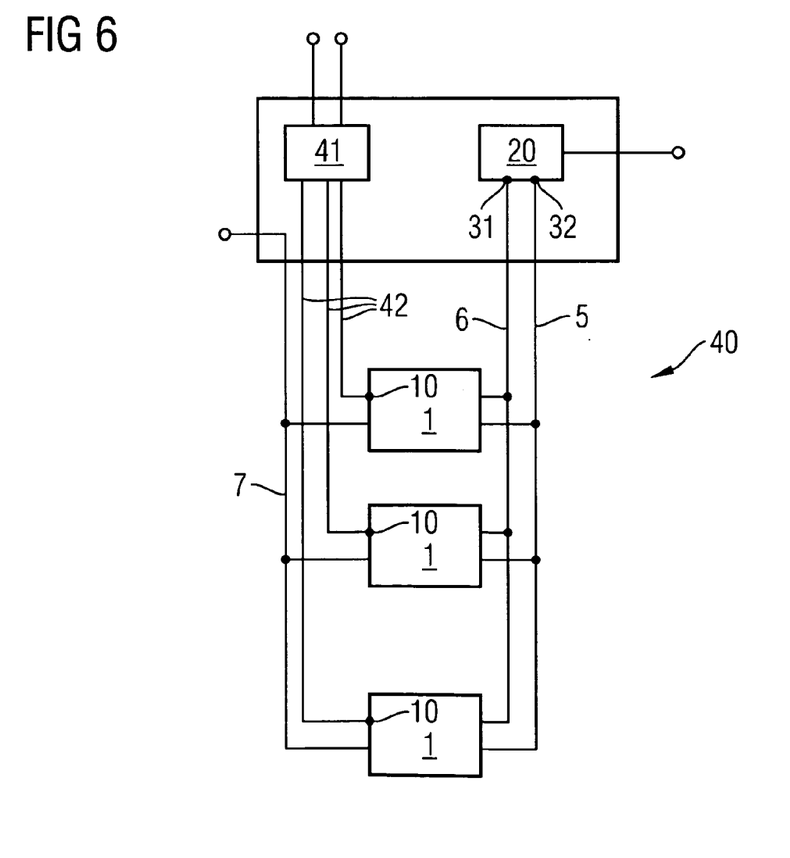
FIG. 6 illustrates one embodiment of a memory assembly having three memory cells and one read device.

FIG. 6 illustrates one embodiment of a memory assembly 40, which has several memory cells 1 and a read device 20. The memory cells 1 each have a control terminal 10 instead of each having a read control terminal 9 and a write control terminal 8. The memory assembly 40 further has a control logic unit 41, a selection line 42 for each memory cell 1, a write line 7, and two read lines 5, 6.

To write a bit into a memory cell 1, the memory assembly 40 assumes that a potential corresponding to this bit is present at a terminal of the memory assembly 40, which is connected to the write line 7. Via the control logic unit 41, the memory assembly 40 then activates the corresponding memory cell 1, into which the bit to be saved should be written. To do this, the control logic unit 41 activates the corresponding selection line 42, which is connected to the corresponding memory cell 1.

To read a bit from a memory cell 1, it is assumed that the first read line 5 is at $V_{DD}$ and the second read line 6 at $V_{SS}$, supplied by a further device (not illustrated) of the memory assembly 40, as is usual according to conventional memory assemblies. The further device is then deactivated, so that it no longer draws the read lines towards $V_{SS}$ or $V_{DD}$, and the corresponding memory cell 1 is activated via the control logic unit 41 via the corresponding selection line 42, so that depending on the memory contents of the activated memory cell 1, the potential difference between the two read lines 5, 6 is either levelled or left. The read device 20 captures the current that flows between the two read lines 5, 6, as is explained in more detail later, and decides dependent on this whether a further terminal of the read device 20, over which the memory contents of the activated memory cell 1 can be tapped by the memory assembly 40, is set to $V_{DD}$ or $V_{SS}$.

According to one embodiment, for all memory cells of the memory assembly which are not being written or read, at least one of the transistors of the relevant memory cell is provided with a bias voltage such that a threshold voltage of such a biased transistor is higher in comparison to a transistor that is not biased in this way. This is also termed back bias.

The increase of the threshold voltage causes a reduction of the leakage current of the relevant transistor, as a result of which the power consumption of the memory cell and hence of the memory assembly of such an embodiment is lowered. While the access time of the memory cell is also thereby increased, this is no disadvantage as the threshold voltage is only raised for transistors that belong to memory cells which are being neither read nor written at this time.

In addition, the memory cell used in the above embodiment needs no supply voltage feed lines except for the substrate and well contacts, because the energy for a read operation is supplied over the read lines and for the write operation over the write line, as a result of which the memory assembly according to the embodiment has only few supply voltage lines. Since in such a case the energy fed over the read lines is lower than with, for example, a supply voltage line carrying a supply voltage, the metallizing of the read lines (e.g., the width of the conducting track of the read line) can be dimensioned smaller than for a supply voltage line. Since in addition a reference potential can be set jointly for the capacitance of each memory cell for all memory cells of the memory assembly, which is advantageous (especially with regard to overload) for metal levels 1 and 2 of a semiconductor circuit which contains the memory assembly according to embodiments, precisely these metal levels 1 and 2 can be developed with a width that is lower in comparison to conventional memory assemblies. If the capacitance is implemented by wiring lines, the reference potential can be applied in an upper metal level of the semiconductor circuit. The number of metal levels in levels 1 and 2 (i.e., in the lowest two metal levels of the semiconductor circuit) may thereby be reduced in corresponding particular embodiments.

In relation to the substrate and well contacts, it is also noted that these contacts may be jointly supplied with the supply voltage for an entire line or column of the memory assembly according to embodiments.

Figure 7:
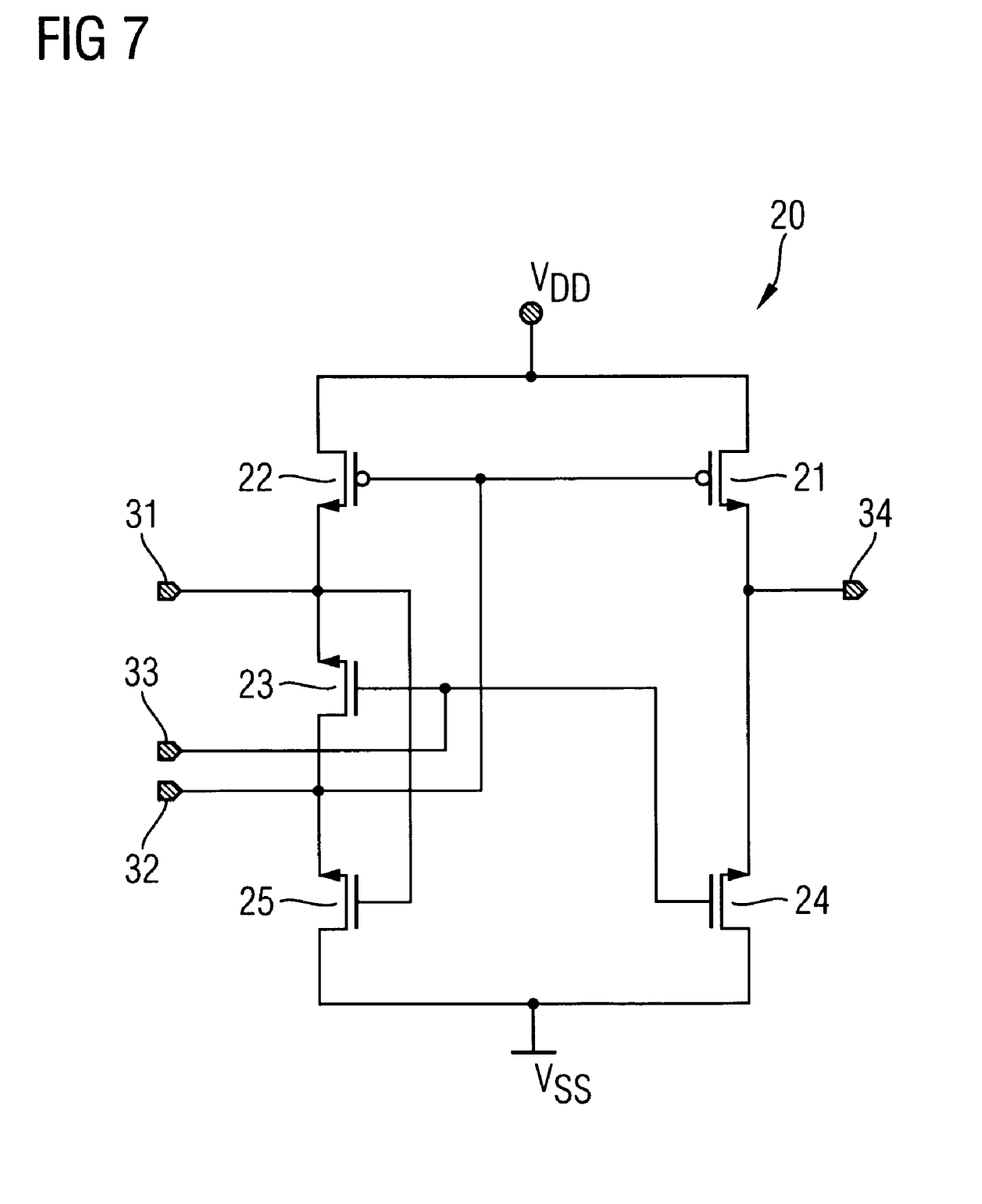
FIG. 7 illustrates one embodiment of a read device.

In FIG. 7, one embodiment of a read device 20 is illustrated. This read device 20 contains a first PMOS transistor 21, a second PMOS transistor 22, a third NMOS transistor 23, a fourth NMOS transistor 24 and a fifth NMOS transistor 25. In addition, the read device 20 has a first input terminal 31 and a second input terminal 32, as well as an output terminal 34 and a control terminal 33. The source terminal of the first PMOS transistor 21 and the source terminal of the second PMOS transistor 22 are connected to $V_{DD}$. The first input terminal 31 is connected to the drain terminal of the second PMOS transistor, to the drain terminal of the third NMOS transistor 23 and to the control input of the fifth NMOS transistor 25. The second input terminal 32 is connected both to the control input of the first PMOS transistor 21 and to the control input of the second PMOS transistor 22, as well as to the source terminal of the third NMOS transistor 23 and to the drain terminal of the fifth NMOS transistor 25. Both the control input of the third NMOS transistor 23 and the control input of the fourth NMOS transistor 24 are connected to the control terminal 33 of the read device 20. In addition, the drain terminal of the first PMOS transistor 21, the drain terminal of the fourth NMOS transistor 24 and the output terminal 34 of the read device 20 are connected. The source terminal of the fourth NMOS transistor 24 and the source terminal of the fifth NMOS transistor 25 are electrically connected to $V_{SS}$.

The read device 20 can be switched on and off with the control terminal 33. While the control terminal 33 is connected to $V_{SS}$, the third NMOS transistor 23 and the fourth NMOS transistor 24 are deactivated or switched to a high resistance, as a result of which the current through the two PMOS transistors 21, 22 is also reduced to a minimum, so that the read device 20 is effectively switched off. In this deactivated state, the read device 20 consumes very little power, which is why this state is typically employed when no memory contents of a memory cell 1 are to be captured via this read device 20. Conversely, this means that for the following considerations relating to a read of contents stored in a memory cell 1 according to embodiments, it is assumed that the control terminal 33 is on $V_{DD}$, or the read device 20 is switched on.

In a different embodiment, the transistor 23 can be designed as a p-channel transistor or PMOS transistor. In this embodiment, however, an additional inverter is employed, because the PMOS transistor that replaces the transistor 23 and the NMOS transistor 24 must be activated with complementary signals.

To enable the read device 20 to capture the contents stored in a memory cell 1 according to embodiments, the read lines 5, 6 are connected to the input terminals 31, 32. Assuming the memory cells 1 illustrated in FIGS. 1 to 5, the first read line 5 is connected to the first input terminal 31 and the second read line 6 to the second input terminal 32.

For reading a memory cell correspondingly connected to the read device 20, first the read device is activated via the control terminal 33, as a result of which the read device or the amplifier 20 sets its own operating point. In this operating point the potential present at the first input terminal 31 is moved rather towards $V_{SS}$, while the potential present at the second input terminal 31 is moved rather towards $V_{DD}$, so that there is a non-zero voltage present between the source and the drain terminal of both the second PMOS transistor 22 and the fifth PMOS transistor 25.

It is also possible that the read device 20 is continuously activated (control terminal 33 is always on $V_{DD}$), in order to save the time taken up for setting the operating point. This speeds up a read operation at the cost of energy consumption.

The read device 20 works in the operating point as a current mirror or a single-stage amplifier. As a result of the structure of the read device 20, the current through the first PMOS transistor 21 is the same as the current through the second PMOS transistor 22. Since the memory cell 1 lies parallel to the third NMOS transistor 23 over the read lines 5, 6, the current that flows through the second PMOS transistor 22 also flows through the parallel connection of the memory cell 1 and the third NMOS transistor 23. Consequently the current through the memory cell 1 also determines the current through the second PMOS transistor 22 and thus the current through the first PMOS transistor 21 and hence the current through the fourth NMOS transistor 24.

As already described previously in the description of the first embodiment of the memory cell 1 illustrated in FIG. 1, a binary 1 stored in the memory cell 1 has the effect that the electrical connection within the memory cell 1 between the two read lines 5, 6 is low-impedance, which in comparison to a binary 0 stored in the memory cell 1 leads to a raised current flow through the memory cell 1. As a result, for the case that a binary 1 is stored in the memory cell 1 to be read, a higher current flows through second PMOS transistor 22 and thus through the first PMOS transistor 21, than if a binary 0 is stored in the memory cell 1 to be read. The higher the current through the first PMOS transistor 21, the higher also is the current through the fourth NMOS transistor 24. Since the voltage between the control input and the source terminal is constant for the fourth NMOS transistor 24, the voltage between the drain terminal and the source terminal of the fourth NMOS transistor 24 is proportional to the current through the fourth NMOS transistor 24. The potential of the output terminal of the read device 20 for a relatively high current through the fourth NMOS transistor 24 (and hence also through the first PMOS transistor 21) brought about by a relatively high current through the memory cell 1 to be read is thus in the region of $V_{DD}$, as a result of which a binary 1 is represented at the output terminal 34. In contrast to this, based on the same considerations, the potential of the output terminal 34 is in the region of $V_{SS}$, if the current through the fourth NMOS transistor 24 is relatively low, as a result of which a binary 0 is represented at the output terminal 34.

In other words, the read device according to such an embodiment is able to decide, based on the size of the current flow between its two input terminals, whether a 0 or a 1 is coded via of two lines respectively connected to the two input terminals.

Since a read device according to the embodiment described above only includes five transistors, it has a low space requirement compared to conventional read devices, although it can not only read an item of information, but is also able before the actual read operation to charge or precharge to different potentials the two input terminals via which it captures the information, in order thereby to set its own operating point.

Since a read device as described above sets its operating point itself, a further circuit that sets the operating point is not needed. In this respect it is noted that a development of such a circuit, which sets an operating point for another circuit, can only be implemented with difficulty by a design method or a circuit generator.

In the read device according to an embodiment as described above, only three of the five transistors are connected in series.

Since the supply voltage is apportioned over the transistors connected in series, and each transistor needs a certain voltage difference between its non-control terminals (e.g., source and drain terminal for an NMOS or PMOS transistor) for optimal operation, the supply voltage of a memory cell is higher the more transistors are connected in series within the memory cell. In other words, the read device according to such an embodiment can be operated with a low supply voltage, because in such a read device only three transistors are connected in series.

The read device according to embodiments is not only able to capture memory contents of memory cells according to embodiments, but the read device according to embodiments can also be used to read memory contents of other memory cells adapted for differential reading, for example correspondingly adapted conventional 6T cells. In other words, both the memory cell described above and the read device described above can be used independently of each other (i.e., the memory cell can interact with other read devices and the read device can read memory contents of other memory cells).

Since the read device according to the described embodiments uses a current value to capture which information is stored in a memory cell, the read device is also suitable for capturing an item of information which is stored in a memory cell, which changes its resistance value dependent on the information stored in it, so that in a read operation the memory cell changes the current between the two input terminals of the read device dependent on the information stored in it. Such memory cells are referred to as "Phase-Changing Memory", in which the resistance of the memory cell is changed by temperature differences because of a transition from an amorphous structure into a crystalline structure (or conversely). Magnetoresistive random access memory (MRAM) or conductive bridging RAM (CBRAM) memory units are other variants of memory cells, which reflect the stored information as a change of resistance.

In another embodiment of a read device, the PMOS transistors 21, 22 of the embodiment represented in FIG. 7 of the read device 20 are replaced by NMOS transistors and the NMOS transistors 23, 24, and 25 by PMOS transistors. The supply voltage terminals $V_{SS}$, $V_{DD}$ are also swapped. To activate the read device, the control terminal is connected to $V_{SS}$. For a read operation, the first input terminal is pre-charged with $V_{SS}$ and the second input terminal with $V_{DD}$. The output terminal has a potential in the region of $V_{SS}$, if a relatively high current is recorded in the reading of the relevant memory cell 1, and otherwise $V_{DD}$.

As indicated in the below Table 1, this results in four different possible combinations for an interaction of the different embodiments of the memory cell and the read device, which depend on whether the memory cell according to embodiments is constructed with NMOS or PMOS transistors and whether the read device according to embodiments contains an NMOS or PMOS transistor as third transistor.

TABLE 1

Possible combinations of different embodiments of the memory cell and read device

|  | Read device contains two PMOS transistors and three NMOS transistors | Read device contains two NMOS transistors and three PMOS transistors |
|---|---|---|
| Memory cell contains NMOS transistors | Potential near $V_{DD}$ at output terminal represents a binary 1 | Potential near $V_{DD}$ at output terminal represents a binary 0 |
| Memory cell contains PMOS transistors | Potential near $V_{DD}$ at output terminal represents a binary 0 | Potential near $V_{DD}$ at output terminal represents a binary 1 |

Therefore, a memory assembly according to embodiments comprises at least one read device according to embodiments and several memory cells. One or more or all of these memory cells can be memory cells according to embodiments.

The described embodiments may be used in large memory assemblies integrated in semiconductor circuits, where the semiconductor circuit is operated with a low supply voltage (e.g., <1V), is designed for low-energy operation, but nonetheless needs a fast access time on its memory assembly. The embodiments are also suitable for forming smaller uniform blocks from memory cells and read devices, in order thereby to avoid problems with mismatched memory cells. Mismatches occur primarily as a result of statistical fluctuations of the transistors used. For example, the 6T memory cell is very susceptible to such fluctuations. The invention, however, is not restricted to these areas of application, but can also be used, for example, for semiconductor circuits which work with a higher supply voltage (>1V).

It is also possible to construct a memory cell according to embodiments or a read device according to an embodiment, which has more than 3 or 5 transistors respectively, in that for example two transistors are connected in parallel and in functional terms are operated respectively as one transistor of the memory cell or of the read device. All memory cells and read devices which in addition to the 3 and 5 transistors respectively also have redundant circuitry parts, which are not necessary for the function of the memory cell or the read device respectively, are also intended to be within the scope of the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory cell, comprising:
   transistors; and
   two read ports, each read port configured to be connected to a read line, wherein the memory cell is configured such that in a read operation of the memory cell an information stored in the memory cell is readable by a differential reading including an evaluation of an electric current between the two read ports, wherein the memory cell is configured such that in a read operation, for a case that the memory cell stores a binary 0 or a 1 respectively, the memory cell sets an electrical connection between the two read ports to low impedance, in comparison to a case that the memory cell stores a binary 1 or a 0 respectively.

2. The memory cell according to claim 1, wherein the memory cell comprises exactly three transistors.

3. The memory cell according to claim 1, wherein the transistors are all of the same conductivity type.

4. The memory cell according to claim 1, wherein the transistors are one of all NMOS transistors or all PMOS transistors.

5. The memory cell according to claim 1, wherein the transistors are of different conductivity types.

6. A memory cell, comprising:
   a first read port;
   a second read port;
   a first transistor having a first terminal operatively connected to the first read port, a second terminal, and a control input;
   a second transistor having a first terminal operatively connected to the second terminal of the first transistor, a second terminal operatively connected to the second port, and a control input;
   a third transistor having a first terminal and second terminal operatively connected to the control input of the second transistor;
   a write port operatively connected to the first terminal of the third transistor;
   a write control terminal operatively connected to the control input of the first transistor; and
   a read control terminal operatively connected to the control input of the first transistor.

7. The memory cell according to claim 6, comprising:
   a capacitance configured to store the information stored in the memory cell, wherein the capacitance has a first terminal operatively connected to the second terminal of the third transistor.

8. The memory cell according to claim 7, wherein the capacitance has a second terminal connected to a reference voltage.

9. The memory cell according to claim 7, wherein the capacitance has a second terminal operatively connected to the second terminal of the first transistor and the first terminal of the second transistor.

10. The memory cell according to claim 7, wherein the write control terminal and the read control terminal are combined in one terminal.

11. A memory assembly configured to read and write information, comprising:
   two read lines;
   one write line;
   at least two memory cells, each of the memory cells comprising:
   a first read port operatively connected to one of the two read lines;
   a second read port operatively connected to the other one of the two read lines;
   a first transistor having a first terminal operatively connected to the first read port, a second terminal, and a control input;
   a second transistor having a first terminal operatively connected to the second terminal of the first transistor, a second terminal operatively connected to the second port, and a control input;
   a third transistor having a first terminal and second terminal operatively connected to the control input of the second transistor;
   a write port operatively connected the write line and to the first terminal of the third transistor;
   a write control terminal operatively connected to the control input of the first transistor; and
      a read control terminal operatively connected to the control input of the first transistor; and
   an arrangement configured to activate at least one of the at least two memory cells to read or write the information stored therein.

12. The memory assembly according to claim 11, wherein the memory assembly is configured such that before a read operation of the memory assembly the two read lines are pre-charged to different potentials.

13. The memory assembly according to claim 11, wherein the memory assembly is configured such that for memory cells which are not being written or read, at least one of the transistors of the respective memory cell is biased such that a threshold voltage of the at least one of the transistors is higher in comparison to transistors of a memory cell, which is being written or read.

14. The memory assembly according to claim 11,
   wherein one of the two read lines and the write line are combined in a read/write line; and
   wherein in each of the at least two memory cells one of the first or second read ports is operatively connected to the other one of the two read lines and the other one of the first or second read ports and the write port are operatively connected to the read/write line.

15. A read device, comprising:
   transistors;
   two input terminals; and
   one output terminal;
   means for reading a one-bit information via a current that flows between the two input terminals;
   means for providing the one-bit information via the output terminal; and
   means for setting the read device's own operating point by setting the potential of the two input terminals.

16. The read device according to claim 15, wherein the read device comprises exactly five transistors.

17. The read device according to claim 15, wherein the read device is arranged as a current mirror.

18. The read device according claim 15, wherein the read device is arranged as a single-stage amplifier.

19. The read device according to claim 15, wherein only three of the transistors are connected in series between two supply voltages of the read device.

20. A read device comprising:
   two input terminals;
   one output terminal;
   a first transistor of a first conduction type including:
   a first terminal;
   a second terminal; and
   a control input;
   a second transistor of the first conduction type including:
   a first terminal operatively connected to the first terminal of the first transistor and a first supply voltage;
   a second terminal; and
   a control input;
   a third transistor of a second conduction type including:
   a first terminal;
   a second terminal; and
   a control input;
   a fourth transistor of the second conduction type including:
   a first terminal operatively connected to the second terminal of the first transistor and the output terminal of the read device;
   a second terminal; and
   a control input operatively connected to the control input of the third transistor and the first supply voltage; and
   a fifth transistor of the second conduction type including:
   a first terminal operatively connected to a second one of the two input terminals of the read device, the control input of the first transistors, the control input of the second transistor, and the second terminal of the third transistor;
   a second terminal operatively connected the second terminal of the fourth transistor and a second supply voltage; and
   a control input operatively connected to a first one of the two input terminals of the read device, the second terminal of the second transistor, and the first terminal of the third transistor.

21. The read device according to claim 20, comprising:
   a control input configured to receive control to switch the read device on and off, wherein the control input of the read device is operatively connected to the control input of the third transistor and the control input of the fourth transistor.

22. The read device according to claim 20, wherein the first, second, fourth and fifth transistor have a higher current than the third transistor through the respective transistor in a conducting state.

23. The read device according to claim 20, wherein a setting of an operating point of the read device is adjustable by a correspondingly matched design of the second, third and fifth transistors.

24. The read device according to claim 20,
   wherein the first and second transistors are PMOS transistors;
   wherein the third, fourth, and fifth transistors are NMOS transistors; and
   wherein the first supply voltage has a higher potential than the second supply voltage.

25. The read device according to claim 20,
   wherein the first and second transistors are NMOS transistors;

wherein the third, fourth, and fifth transistors are PMOS transistors; and wherein the second supply voltage has a higher potential than the first supply voltage.

26. A memory assembly comprising:

memory cells, each memory cell including transistors and two read ports;

at least one read device including transistors, two input terminals, and one output terminal, the at least one read device configured to read a one-bit information via a current that flows between the two input terminals, provide the one-bit information via the output terminal, and set its own operating point by setting the potential of the two input terminals;

a first line connected to a first one of the two read ports of each memory cell and to one of the two input terminals of the read device; and a second line connected to a second one of the two read ports of each memory cell and to the other one of the two input terminals of the read device.

27. The memory assembly according to claim 26, wherein for at least one of the memory cells each read port is configured to be connected to a read line, wherein the at least one memory cell is configured such that in a read operation of the memory cell an information stored in the memory cell is readable by a differential reading including an evaluation of an electric current between the two read ports.

28. The memory assembly according to claim 26, wherein at least one of the memory cells has an electrical resistance dependent on an information stored in the memory cell.

29. The memory assembly according to claim 28, wherein the at least one memory cell is one of a phase-changing memory, a magnetoresistive memory, and a conductive bridging memory.

30. A method of operating a memory cell, the method comprising:

reading information stored in the memory cell with a differential read operation including evaluating an electric current between two read ports of the memory cell; and during the reading, connecting only a well contact and a substrate contact of the memory cell with a supply voltage.

31. The method according to claim 30, comprising:

pre-charging two read lines connected to the two read ports to different potentials.

* * * * *